(12) United States Patent
Park et al.

(10) Patent No.: US 9,888,599 B2
(45) Date of Patent: Feb. 6, 2018

(54) PROTECTING COVER FOR ELECTRONIC DEVICE

(71) Applicant: Samsung Electronics Co., Ltd., Gyeonggi-do (KR)

(72) Inventors: Sung-Jin Park, Seoul (KR); Seong-Woon Kang, Gyeonggi-do (KR); Young-Woong Kim, Seoul (KR); Kyu-Suk Lee, Gyeonggi-do (KR); Jong-In Lee, Gyeonggi-do (KR); Kyung-Hoon Cha, Seoul (KR)

(73) Assignee: Samsung Electronics Co., Ltd. (KR)

( * ) Notice: Subject to any disclaimer, the term of this patent is extended or adjusted under 35 U.S.C. 154(b) by 119 days.

(21) Appl. No.: 14/295,854

(22) Filed: Jun. 4, 2014

(65) Prior Publication Data

US 2014/0376192 A1 Dec. 25, 2014

(30) Foreign Application Priority Data

Jun. 21, 2013 (KR) ........................ 10-2013-0071383

(51) Int. Cl.
| | |
|---|---|
| *H03K 17/94* | (2006.01) |
| *H05K 5/03* | (2006.01) |
| *A45C 11/00* | (2006.01) |
| *H04B 1/3888* | (2015.01) |
| *G06F 1/16* | (2006.01) |
| *G06F 1/32* | (2006.01) |

(52) U.S. Cl.
CPC ................ *H05K 5/03* (2013.01); *A45C 11/00* (2013.01); *G06F 1/1626* (2013.01); *G06F 1/1647* (2013.01); *G06F 1/1683* (2013.01); *G06F 1/1698* (2013.01); *G06F 1/3206* (2013.01); *G06F 1/3215* (2013.01); *G06F 1/3265* (2013.01); *H04B 1/3888* (2013.01); *A45C 2011/002* (2013.01); *A45C 2200/15* (2013.01); *G06F 2200/1634* (2013.01); *Y02B 60/1242* (2013.01)

(58) Field of Classification Search
CPC .. H05K 5/03; H04B 1/3888; G06F 2200/1633
USPC .......... 361/679.01, 681, 683, 686; 455/575.3
See application file for complete search history.

(56) References Cited

U.S. PATENT DOCUMENTS

| | | | | |
|---|---|---|---|---|
| 2004/0207568 | A1* | 10/2004 | Ooshima | G06F 1/162 345/1.1 |
| 2009/0162069 | A1* | 6/2009 | Magnusson | G08C 23/04 398/106 |
| 2010/0141689 | A1* | 6/2010 | Johnson | G06F 1/1647 345/690 |
| 2010/0177036 | A1* | 7/2010 | Nam | G06F 1/1616 345/156 |

(Continued)

*Primary Examiner* — Tuan T Dinh
*Assistant Examiner* — Rockshana Chowdhury
(74) *Attorney, Agent, or Firm* — The Farrell Law Firm, P.C.

(57) ABSTRACT

A protecting cover for an electronic device is provided, the protecting cover including a front cover portion positioned on a front surface of the electronic device, a back cover portion connected with the front cover portion and positioned on a back surface of the electronic device, an auxiliary display unit provided on the front cover portion, and a module configured to control transmission and reception of data and power supply depending on opening and closing of the front cover portion.

15 Claims, 8 Drawing Sheets

(56) References Cited

U.S. PATENT DOCUMENTS

| | | | |
|---|---|---|---|
| 2012/0194448 A1* | 8/2012 | Rothkopf | A45C 13/002 345/173 |
| 2012/0281356 A1* | 11/2012 | Brewer | A45C 11/00 361/679.55 |
| 2012/0320262 A1* | 12/2012 | Chung | H05B 33/0863 348/370 |
| 2013/0101285 A1* | 4/2013 | Shar | H04B 10/1149 398/38 |

* cited by examiner

PROTECTING COVER FOR ELECTRONIC DEVICE

PRIORITY

This application claims priority under 35 U.S.C. §119(a) to a Korean Patent Application filed in the Korean Intellectual Property Office on Jun. 21, 2013 and assigned Serial No. 10-2013-0071383, the entire disclosure of which is incorporated herein by reference.

BACKGROUND

1. Field of the Invention

The present invention generally relates to a protecting cover, and more particularly, to a protecting cover that protects an electronic device.

2. Description of the Related Art

Recently, electronic devices such as cellular phones, MP3 players, Portable Multimedia Players (PMPs), electronic-book terminals, and smart phones have become popular with users, and the users enjoy various contents while carrying the electronic devices.

The users may perform wireless communication with other while using the portable electronic devices which they carry with them. The portable electronic device typically includes a display unit, an antenna device, an input/output device, and a data transmission/reception device.

With the dramatic advances in multimedia and display technologies, a resolution of the display unit of the portable electronic device has been improved and a touchscreen is now provided in the display unit, such that the user may manipulate the electronic device by touching the display unit of the electronic device with a finger or a stylus pen.

As such, on a front surface of the display unit of the portable electronic device, a protecting cover is provided to prevent damage of the display unit due to a scratch or a shock generated when the electronic device is dropped and touched.

The protecting cover is manufactured for protecting the display unit, so that it is formed of various materials, including both soft and hard materials. For example, the protecting cover may be formed of a soft plastic or leather material.

However, since a conventional protecting cover covers the display unit of the portable electronic device when the portable electronic device is not used, the user cannot see contents of the display unit. For example, the user needs to open the protecting cover to check the display unit to see simple reception data or transmission data. That is, each time when using the portable electronic device, to see contents of the display unit, the user has to open the protecting cover and press a button provided on the portable electronic device.

Thus, a need exists for a device that allows users to see contents of a display unit provided in a portable electronic device without opening the protecting cover.

SUMMARY

The present invention has been made to address at least the above-mentioned problems and/or disadvantages and to provide at least the advantages described below.

Accordingly, an aspect of the present invention is to provide a protecting cover of an electronic device, in which an auxiliary display unit for displaying data of the electronic device is provided in a front cover portion of the protecting cover, such that information of the electronic device may be seen without a need to open or close the protecting cover.

Another aspect of the present invention is to provide a protecting cover of an electronic device, in which transmission and reception of data of the electronic device and data of an auxiliary display unit provided in a front cover portion and power supply are controlled depending on the opening and closing of the front cover portion, such that data transmission and reception of the electronic device and the auxiliary display unit are made easy, power consumption is reduced, the cost of a product is reduced by removing a need for conventional connection terminals for data transmission and reception and power supply, and the slimness of the product is achieved due to a reduction in the number of parts of the product.

Another aspect of the present invention is to provide a protecting cover of an electronic device, in which a self power supply device for supplying power is provided in an auxiliary display unit of a front cover portion, such that power necessary for the auxiliary display unit is self-supplied within the auxiliary display unit, thereby increasing the time the auxiliary display unit may be used and thus improving the utilization of a product.

Another aspect of the present invention is to provide a protection cover of an electronic device, in which a power connection portion electrically connected with an existing power terminal included in the electronic device is provided to supply power to an auxiliary display unit provided in a front cover portion of the protection cover, such that the protection cover may become slim due to the use of the existing power terminal without adding a separate connection terminal. Another aspect of the present invention is to provide a protection cover of an electronic device, in which a power connection portion is provided to wirelessly supply power of a battery pack included in the electronic device to an auxiliary display unit provided in a front cover portion, such that the protection cover may become slim since there is no need for existing terminals electrically connected for power supply to the auxiliary display portion.

In accordance with an aspect of the present invention, a protection cover includes a front cover portion provided on a front surface of an electronic device, a back cover portion connected with the front cover and provided on a back surface of the electronic device, an auxiliary display unit provided on the front cover portion, and a module configured to control data transmission and reception and power supply depending on the opening and closing of the front cover portion.

In accordance with another aspect of the present invention, there is provided a protecting cover for an electronic device, the protecting cover including a front cover portion positioned on a front surface of the electronic device, a back cover portion connected with the front cover portion and positioned on a back surface of the electronic device, an auxiliary display unit provided on the front cover portion, and a module configured to control transmission and reception of data and power supply depending on opening and closing of the front cover portion.

In accordance with another aspect of the present invention, there is provided a protecting cover for an electronic device, the protecting cover including a front cover portion positioned on a front surface of the electronic device, a back cover portion connected with the front cover portion and positioned on a back surface of the electronic device, an auxiliary display unit provided on a front surface of the front cover portion, a self-power supply unit provided on a back surface of the front cover portion to supply power to the auxiliary display unit, and a module configured to control transmission and reception of data of the electronic device and data of the auxiliary display unit and to control the self-power supply unit, depending on opening and closing of the front cover portion.

In accordance with another aspect of the present invention, there is provided a protecting cover of an electronic device, the protecting cover including a front cover portion positioned on a front surface of the electronic device, a back cover portion connected with the front cover and positioned on a back surface of the electronic device, an auxiliary display unit provided in the front cover portion, a power connection portion electrically connected with a battery pack of the electronic device to supply power to the auxiliary display unit, and a module configured to control transmission and reception of data of the electronic device and data of the auxiliary display unit and to control the power connection portion, depending on opening and closing of the front cover portion.

BRIEF DESCRIPTION OF THE DRAWINGS

The above and other aspects, features and advantages of embodiments of the present invention will be more apparent from the following detailed description taken in conjunction with the accompanying drawings, in which.

Throughout the drawings, like reference numerals will be understood to refer to like parts, components, and structures.

DETAILED DESCRIPTION OF EMBODIMENTS OF THE PRESENT INVENTION

Hereinafter, embodiments of the present invention will be described in detail with reference to the accompanying drawings. In the description herein, well-known functions and structures which may unnecessarily obscure the subject matter of the present invention will not be described. It includes various specific details to assist in that understanding but these are to be regarded as mere examples. Accordingly, those of ordinary skill in the art will recognize that various changes and modifications of the various embodiments described herein can be made without departing from the scope and spirit of the present invention. In addition, descriptions of well-known functions and constructions may be omitted for clarity and conciseness.

FIGS. 1 to 5 are diagrams illustrating a structure of a protecting cover of an electronic device according to a first embodiment of the present invention.

Figure 1:
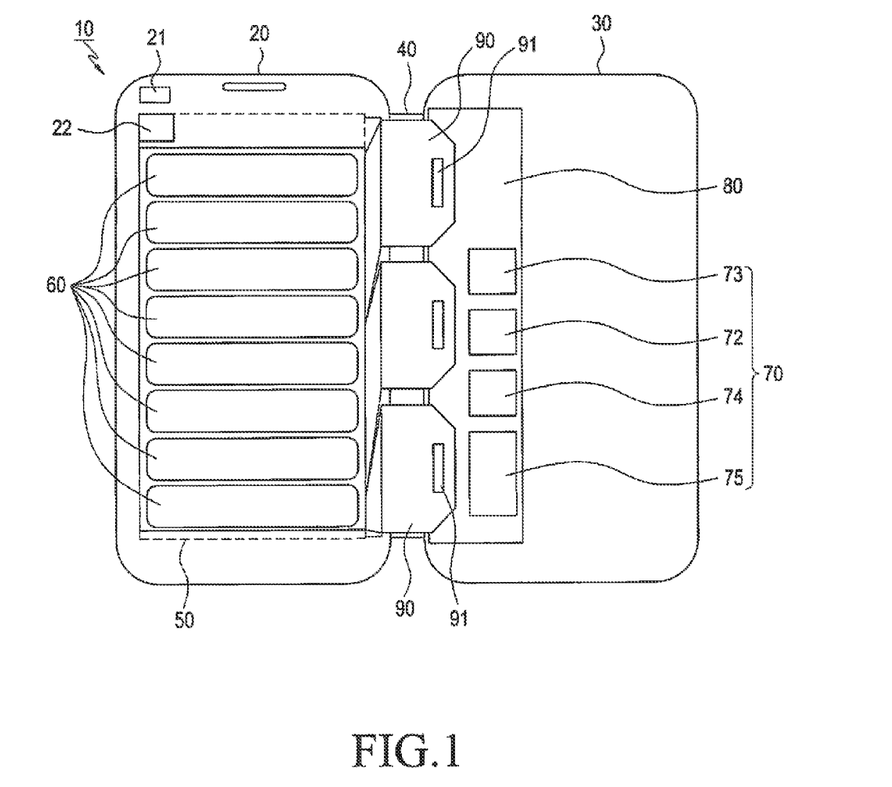
FIG. 1 is a floor plan illustrating a structure of a protecting cover of an electronic device according to a first embodiment of the present invention.
Figure 2:
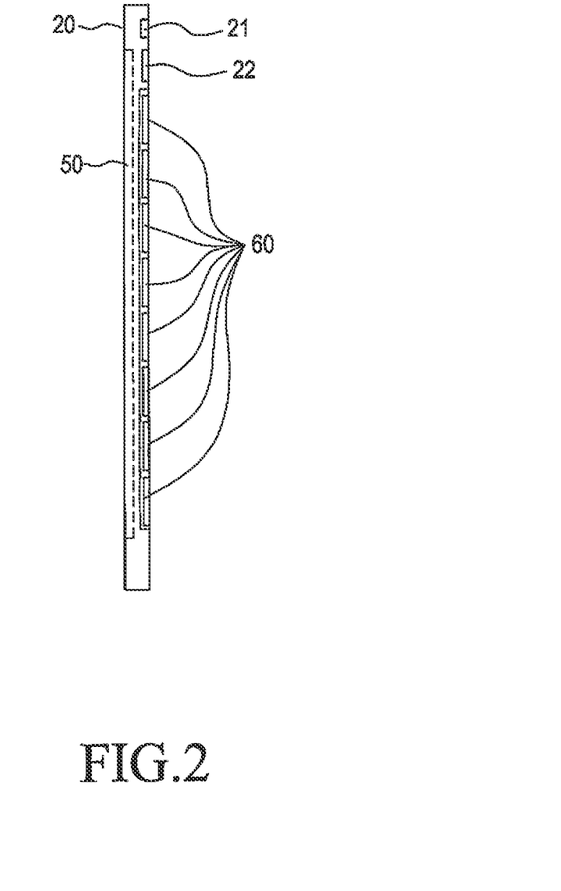
FIG. 2 is a side cross-sectional view illustrating a structure of a protecting cover of an electronic device according to the first embodiment of the present invention.
Figure 5:
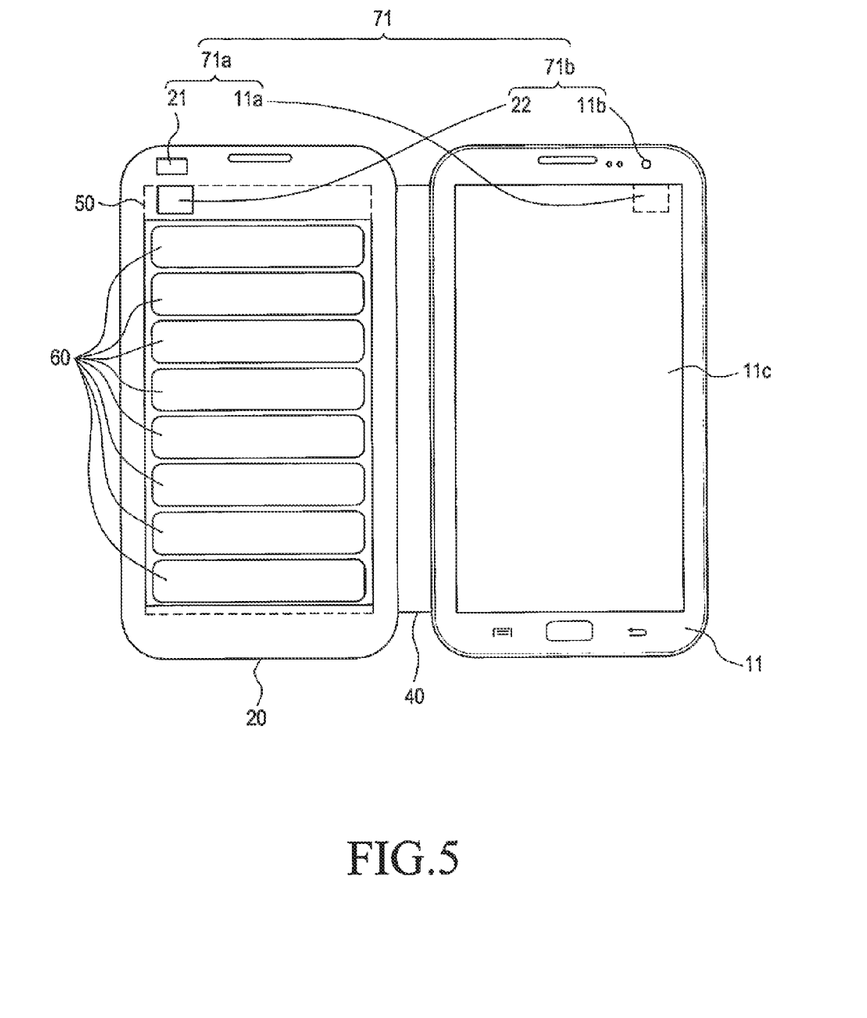
FIG. 5 is a diagram showing a state where a front cover portion of a protecting cover of an electronic device is opened according to the first embodiment of the present invention.

With reference to FIGS. 1 and 2, a protecting cover 10 includes a front cover portion 20, a back cover portion 30, an auxiliary display unit 50, a self-power supply unit 60, and a module 70. As illustrated in FIG. 5, an electronic device 11 includes a main display unit that may be implemented with a touch screen 11c of a capacitive type. The protecting cover 10 includes a flip protecting cover to open or close the touch screen 11c. The front cover portion 20 is positioned on a front surface of the electronic device 11 so that the front cover portion 20 is connected to the back cover portion 30 described below by a connection portion 40 in such a way to rotate and open or close the touch screen 11c by the rotation. The back cover portion 30 is positioned on a back surface of the electronic device 11 in such a way to be connected to the front cover portion 20 by the connection portion 40. The back cover portion 30 is provided to be removable from the back surface of the electronic device 11. The back cover portion 30 may include a battery cover portion for protecting a battery pack (not shown) of the electronic device 11. While the back cover portion 30 is described by using the battery cover portion as an example in the current embodiment, the present invention is not limited to this example. That is, various modifications may be used as long as they provide a structure for protecting the back surface of the electronic device 11.

Like in FIG. 5 mentioned above and shown in FIG. 2, the auxiliary display unit 50 is provided on the front surface of the front cover portion 20 to display data of the electronic device 11 depending on the opening and closing of the front cover portion 20. The self power supply unit 60 is provided on the back surface of the front cover portion 20 to supply power to the auxiliary display unit 50. The module 70 is provided in the back cover portion 30 and the electronic device 11 to control transmission and reception of data of the electronic device 11 or data of the auxiliary display unit 50 and to control the self power supply unit 60 depending on the opening and closing of the front cover portion 20.

In the electronic device 11 including the capacitive touch screen 11c, the capacitive touch screen 11c detects a position touched on a display unit by using a change in a capacitance between a sensor electrode (not shown) and a drive electrode (not shown). For example, capacitances are sequentially measured at multiple intersections formed by multiple sensor electrodes arranged horizontally and multiple drive electrodes arranged vertically, thus sensing a capacitance change at a particular point.

Herein, examples of the electronic device 11 present include any mobile communication terminals operating based on communication protocols corresponding to various communication systems, and any information communication devices and their application devices, such as Portable Multimedia Players (PMPs), MP3 players, navigation systems, game consoles, laptop computers, netbooks, advertisement boards, Televisions (TVs), digital broadcasting players, Personal Digital Assistants (PDAs), and smart phones.

The auxiliary display unit 50 includes at least one of a flexible display, an ElectroPhoretic Display (EPD), an Electronic (E)-paper display, a Thin Film Transistor (TFT) Liquid Crystal Display (LCD), and an Organic Light-Emitting Diode (OLED) display. The auxiliary display unit 50 may also include different types of displays other than the disclosed displays. In the current embodiment, a description will be made assuming that the auxiliary display unit 50 includes the EPD.

As illustrated in FIG. 5, the module 70 may include a short-range communication module. Herein, the short-range communication module may include one of a wireless optical communication module 71, Bluetooth®, WiFi, Radio Frequency Identification (RFID), and Near Field Communication (NFC). Likewise, the short-range communication module 70 may also be a module capable of performing short-range communication of types other than the disclosed short-range communication module 70, such as a proximity sensor or a hall sensor. In the current embodiment, a description will be made assuming that the short-range communication module 70 includes the wireless optical communication module 71.

More specifically, as mentioned with reference to FIGS. 1 and 5, the module 70 may include the wireless optical communication module 71 including a light-emitting unit 71a and a light-receiving unit 71b for data transmission and reception, a first controller 72 and a second controller 73, a power management module 74, and a battery unit 75. The wireless optical communication module 71 may include the light-emitting unit 71a having the display unit of the electronic device 11 or a Light Emitting Diode (LED) 21 and the light-receiving unit 71b having an optical sensor 22 or a front camera 11b.

The optical sensor 22 is provided on a back surface of the front cover portion 20 to correspond to the light-emitting element 11a of the electronic device 11. The LED 21 is provided on the back surface of the front cover portion 20 to correspond to the front camera 11b of the electronic device 11. The light-emitting element 11a may include either an LCD or OLEDs.

That is, if the light-emitting element 11a emits light having a color or flickering on-and-off light, the optical sensor 22 receives this optical signal. On the other hand, if the LED 21 emits light having a color or flickering on-and-off light, the front camera 11b receives this optical signal.

In other words, when the protecting cover 10 is closed and the front cover portion overlays the touch screen 11c of the electronic device 11, if the LED 21 provided on the front cover portion 20 emits and transmits light having a color, the front camera 11b of the electronic device 11 receives this light, and at the same time, detects this light and converts the light into a digital signal, such that data of the auxiliary display unit 50 of the front cover portion 20 is transferred to the electronic device 11. When data is transferred to the auxiliary display unit 50 of the front cover portion 20, the light-emitting element 11a of the electronic device 11 is turned on and off by flickering, and the optical sensor 22 receives the flickering optical signal to convert the optical signal into a digital signal and transfers the data of the electronic device 11 to the auxiliary display unit 50 for displaying of the data.

The first controller 72 controls the driving of the wireless optical communication module 70, and the second controller 73 controls the data transferred to the auxiliary display unit 50 to be displayed on the auxiliary display unit 50.

As illustrated in FIG. 5, the self power supply unit 60 is provided on the back (or inner) surface of the front cover portion 20 to supply power to the auxiliary display unit 50. The self power supply unit 60 may include a solar cell that is provided on the back surface of the front cover portion 20 to supply self-power to the auxiliary display unit 50.

As illustrated in FIG. 1, the power management module 74 supplies the power of the self power supply unit 60 to the auxiliary display unit 50 and controls the power of the self power supply unit 60.

The battery unit 75 charges using the power generated in the self power supply unit 60, and supplies the charged power to the auxiliary display unit 50. For example, the battery unit 75 charges using power generated in the solar cell from sunlight. That is, if the front cover 20 is opened, the solar cell on the back surface of the front cover portion 20 is exposed to sunlight, and the above protection cover 10 generates the power from the sunlight. The solar cell changes the light energy from the solar energy to electrical energy. In addition, if sunlight is projected onto the solar cell, electricity is generated in a Negative Semiconductor and a Positive Semiconductor, generating electrons and an electrical transfer to electrodes. At this time, if the electrodes are connected each other, electricity flows by transferring the electrons.

When sunlight does not exist, e.g., at night, the solar cell is exposed to the light of the touch screen 11c provided in the electronic device 11 to generate power, and the generated power is supplied to the auxiliary display unit 50. Thus, even in the no-sunlight situation, power may be supplied to the auxiliary display unit 50.

The solar cell generates power when exposed to main display unit 11c in electronic device 11, without the sunlight. That is, because the solar cell is on the back surface of the front cover 20 of protection cover 10, if the protection cover 10 is closed, the solar cell faces the main display unit 11c. If the front cover 20 is tilted open or closed from the protection cover 10, the light is emitted by the operation of the main display unit 11c and the emitted light projects to the solar cell, such that the power of the solar cell is generated. Therefore, the solar cell can generate power without sunlight and supply the generated power to the auxiliary display unit 50.

As illustrated in FIG. 1, a circuit board 80 including the first controller 72, the second controller 73, the power management module 74, and the battery unit 75 is provided on the back cover portion 30. The auxiliary display unit 50 may include at least one Flexible Printed Circuit Board (FPCB) 90 for electric connection with the circuit board 80. The FPCB 90 may include a circuit connector 91 electrically connected with the circuit board 80.

Herein, an operation process of the protecting cover 10 according to the current embodiment will be described in more detail.

First, as illustrated in FIGS. 1 and 2, the protecting cover 10 includes the front cover portion 20 and the back cover portion 30. The front cover portion 20 includes the auxiliary display unit 50 on the front surface thereof, and the front cover portion 20 includes the self power supply unit 60 on the back surface thereof. The at least one FPCB included in the auxiliary display unit 50 is electrically connected to the circuit board 80 provided in the back cover portion 30. The circuit connector 91 included in the FPCB is electrically connected with the circuit board 80. The LED 21 of the light-emitting unit 71a is provided on the back surface of the front cover portion 20, and the optical sensor 22 of the light-receiving unit 71b is provided on the back surface of the front cover portion 20.

Figure 3:
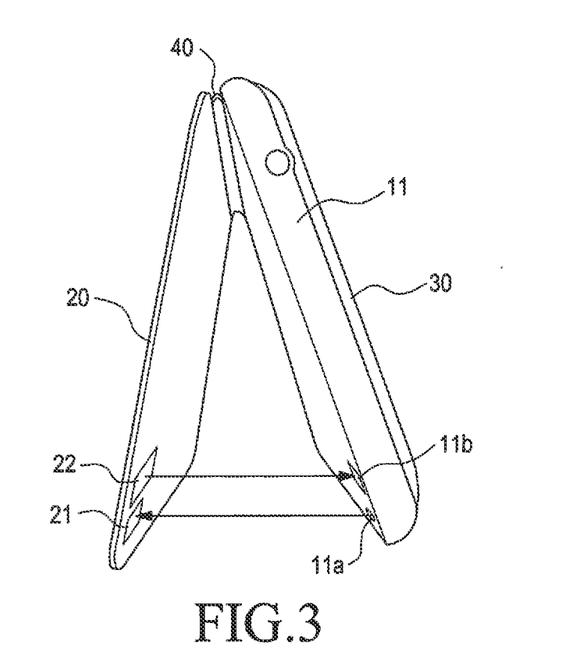
FIG. 3 is a diagram showing an operation process of a protecting cover of an electronic device according to the first embodiment of the present invention.
Figure 4:
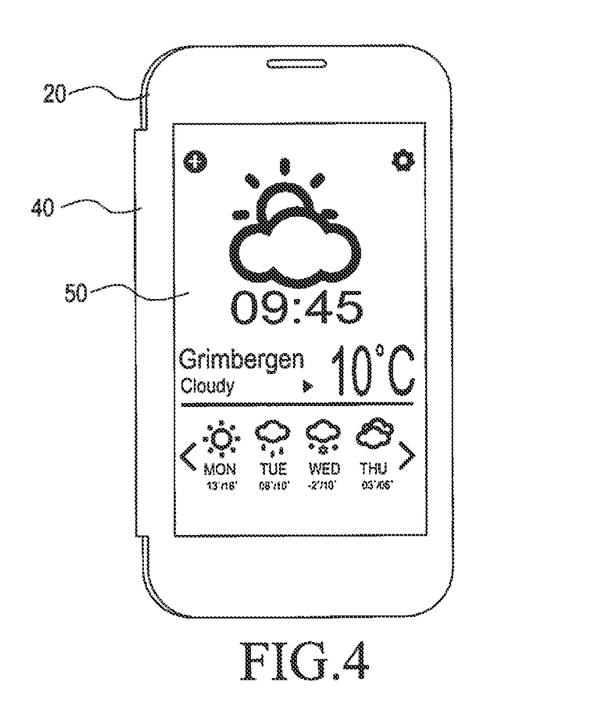
FIG. 4 is a diagram showing a state where a front cover portion of a protecting cover of an electronic device is closed according to the first embodiment of the present invention.

In this state, as illustrated in FIGS. 3 and 4, the back cover portion 30 includes the battery cover portion of the electronic device 11. The back cover portion 30 is mounted on the back surface of the electronic device 11, and the front cover portion 20 is rotated by the connection portion 40 to cover the front surface of the electronic device 11.

That is, the front cover portion 20 closely contacts the front surface of the electronic device 11, the LED 21 of the front cover portion 20 corresponds to the light-emitting element 11a provided on the front surface of the electronic device 11, and the optical sensor 22 of the front cover portion 20 corresponds to the front camera 11b provided on the front surface of the electronic device 11.

Thus, for communication between the electronic device 11 and the auxiliary display unit 50 through the wireless optical communication module 71, if the light-emitting element 11a of the electronic device 11, which is included in the light-emitting unit 71a, emits light having a color or flickering on-and-off light, then the optical sensor 22 of the front cover portion 20, which is included in the light-receiving unit 71b, receives this optical signal to covert the optical signal into a digital signal and transfers data of the electronic device 11 to the auxiliary display unit 50. On the other hand, when the LED 21 of the front cover portion 20, which is included in the light-emitting unit 71a, emits light having a color or flickering on-and-off light, the front camera 11b of the electronic device 11, which is included in the light-receiving unit 71b, receives this optical signal to convert the optical signal into a digital signal and transfers data of the auxiliary display unit 50 to the electronic device 11. The auxiliary display unit 50 is turned on and activated.

As illustrated in FIG. 4, the auxiliary display unit 50 receives and displays data of the electronic device 11. That is, the auxiliary display unit 50 displays reception and transmission of time, weather, a call, or a message to allow a user to know the reception and the transmission of these items, and also displays icons of preset operations such as execution of an application capable of using a social network. For example, an E-book or a moving picture may be displayed.

The auxiliary display unit 50 is supplied with power of the self power supply unit 60 through the power management module 74.

As illustrated in FIG. 5, if the user opens the front surface of the electronic device 11 by rotating the front cover portion 20 by means of the connection portion 40, the front cover portion 20 is rotated away from the front surface of the electronic device 11, and the front surface of the electronic device 11 is also now positioned away from the LED 21 of the front cover portion 20, which is included in the light-emitting unit 71a, and the optical sensor 22 of the front cover portion 20, which is included in the light-receiving unit 71b. That is, the LED 21 and the optical sensor 22 are moved away from the light-emitting element 11a of the electronic device 11, which is included in the light-emitting unit 71a, and the front camera 11b of the electronic device 11, which is included in the light-receiving unit 71b. The light-emitting unit 71a and the light-receiving unit 71b move beyond their transmission and reception areas. In this case, the auxiliary display unit 50 is turned off and the main display unit 11c of the electronic device 11 is turned on and activated. The main display unit 11c may display various images corresponding to various operation states, execution of an application, a service, and the like. Herein, the various operation states indicate voice communication, video communication, a text message, or a multimedia message made through the electronic device 11.

As such, when a conventional protecting cover covers a front surface of an electronic device, it also covers the display unit of the electronic device, such that the user cannot check data on the display unit.

Thus, in the first embodiment of the present invention, as shown in FIG. 1, the front cover portion 20 of the protecting cover includes the auxiliary display unit 50 for displaying data of the electronic device 11, such that the user can check data of the electronic device 11 without opening the front cover portion 20 of the protecting cover.

Also, in the first embodiment of the present invention, the module 70, as shown in FIG. 5, is provided to wirelessly transmit and receive and control data of the electronic device 11 and data of the auxiliary display unit 50, and the self power supply unit 60 is provided to supply power to the auxiliary display unit 50 without a separate battery pack, thereby reducing power consumption occurring in transmission and reception of data. In addition, since there is no need for connection terminals for physical connection, the cost of a product may be reduced and slimness of the product may be achieved. Moreover, by self-supplying power necessary for the auxiliary display unit 50, the time the auxiliary display unit 50 is used will also be increased.

Figure 6:
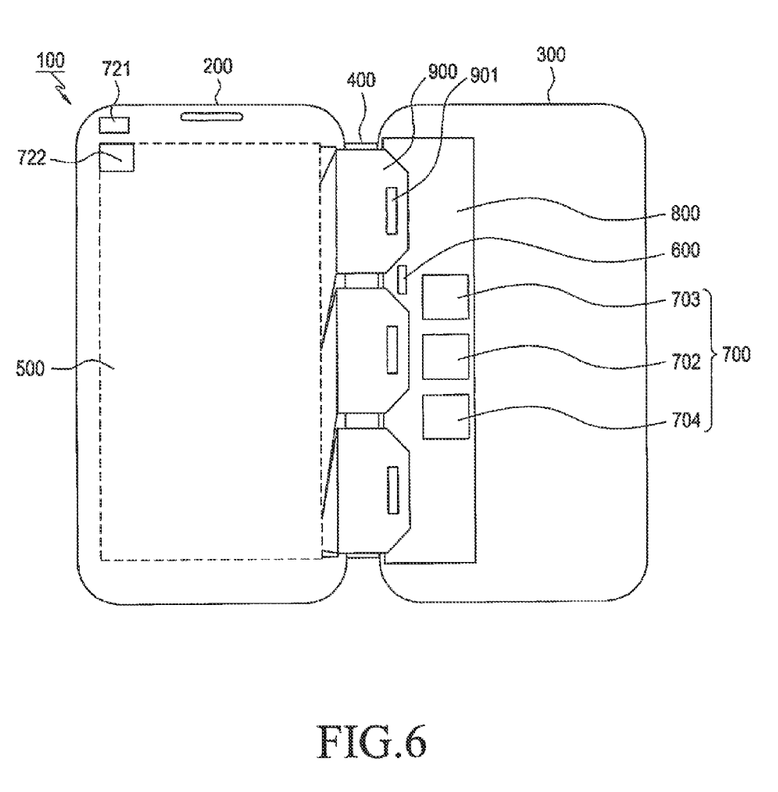
FIG. 6 is a floor plan illustrating a structure of a protecting cover of an electronic device according to a second embodiment of the present invention.
Figure 7:
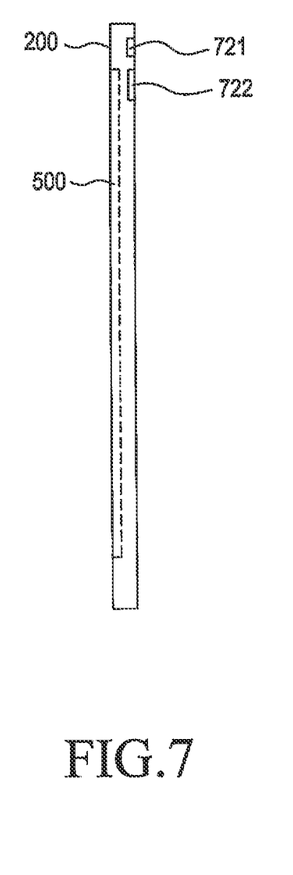
FIG. 7 is side cross-sectional view illustrating a structure of a protecting cover of an electronic device according to a second embodiment of the present invention.
Figure 8:
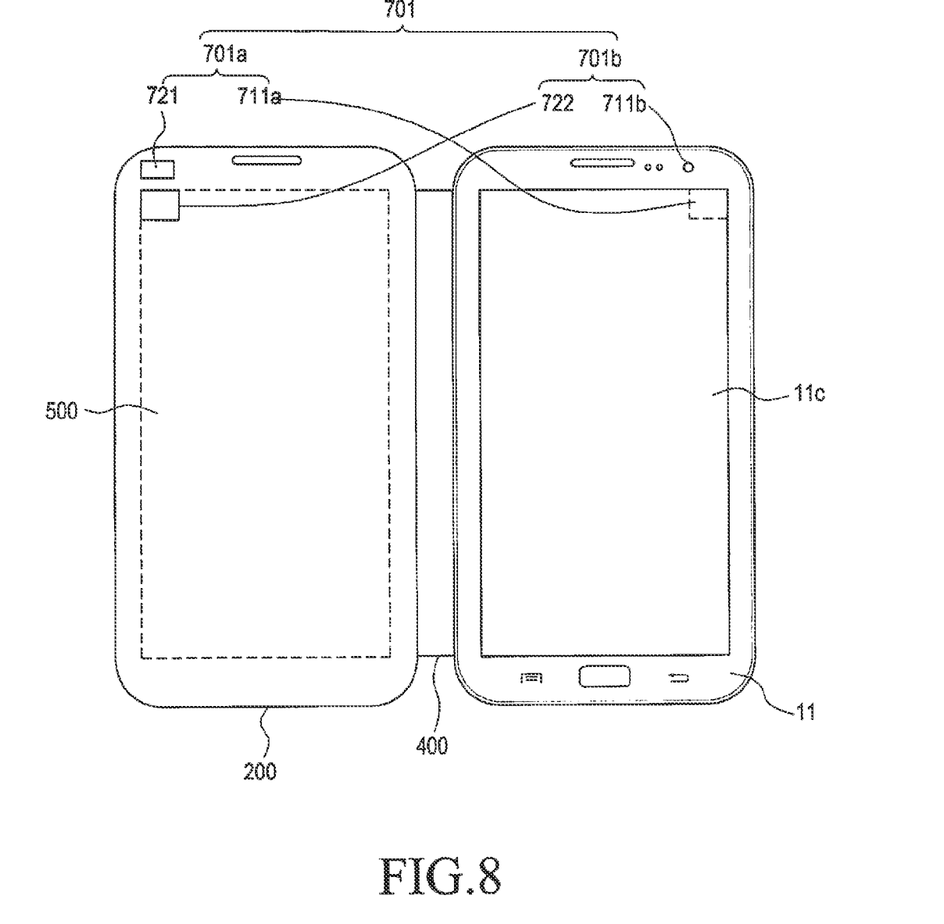
FIG. 8 is a diagram showing a state where a front cover portion of a protecting cover of an electronic device is opened according to the second embodiment of the present invention.

With reference to FIGS. 6 to 8, the protecting cover of the electronic device 11 according to a second embodiment will be described.

Referring to FIGS. 6 and 7, a protecting cover 100 includes a front cover portion 200, a back cover portion 300, an auxiliary display unit 500, a power connection portion 600, and a module 700. The protecting cover 100 includes the aforementioned flip protecting cover for opening and closing the touch screen 11c of the electronic device 11. The front cover portion 200 is positioned on the front surface of the electronic device 11 such that the front cover portion 200 is rotatably coupled with the back cover portion 300 described below by means of the connection portion 400, and the front cover portion 200 opens or closes the touch screen 11c along with the rotation. The back cover portion 300 is positioned on the back surface of the electronic device 11 for connection with the front cover portion 200 by means of the connection portion 400. The back cover portion 300 is removable from the back surface of the electronic device 11.

As illustrated in FIGS. 6 and 8, the auxiliary display unit 500 is provided on the front surface of the front cover portion 200 to display data of the electronic device 11 depending on the opening and closing of the front cover portion 200. The power connection portion 600 is electrically connected with the battery pack (not illustrated) of the electronic device 11 to supply power to the auxiliary display unit 500. The module 700 is provided on the back cover portion 300, and connects to the electronic device 11 to control transmission and reception of data of the electronic device 11 and data of the auxiliary display unit 500 and to control the power connection portion 600.

That is, the power connection portion 600 includes a power connection terminal for electrical connection with a power terminal (not illustrated) electrically connected with the battery pack, of the electronic device 11, such that the auxiliary display unit 500 of the protecting cover 100 uses the power of the battery pack (not illustrated) and thus power consumption necessary for data transmission and reception is low. In other words, power is supplied to the auxiliary display unit 500 using the existing power terminal provided in the electronic device 11, facilitating power supply to the auxiliary display unit 500.

As illustrated in FIG. 6, in another example of the power connection portion 600, the power connection portion 600 is induced as an induced electromotive force by a wireless power transmission terminal (not illustrated) provided in the electronic device 11 and a magnetic field to receive power of the battery pack (not illustrated) included in the electronic device 11, to supply the power to the auxiliary display unit 500.

More specifically, the power connection portion 600 wirelessly transmits power. That is, a power transmission scheme based on electromagnetic induction transmits power between a primary coil and a secondary coil. If a magnet moves through a coil, an induced current is generated and by using the induced current, a magnetic field is generated in a transmission end and a current corresponding to a change in the magnetic field is induced in a reception end, such that power is transmitted.

Thus, the wireless power transmission terminal (not illustrated) includes a wireless power transmission coil to operate as described above, and the power connection portion 600 includes the wireless power transmission coil. In other words, the wireless power transmission terminal includes the primary coil, and the power connection portion 600 includes the secondary coil.

Herein, a description is made using an example in which the power connection portion 600 uses, but is not limited to, the power transmission scheme based on electromagnetic induction. That is, various modifications may also be used as long as they wirelessly transmit power. For example, a resonance scheme using a resonator may also be used.

The current embodiment wirelessly transmits and supplies power of the battery pack (not illustrated) of the electronic device 11 to the auxiliary display unit 500, without needing a separate connection terminal, thereby achieving slimness of the protecting cover 100 and facilitating power supply to the auxiliary display unit 500.

Herein, in the current embodiment, an EPD is used as an example of the auxiliary display unit 500. The module 700 uses a short-range communication module that may include a wireless optical communication module 701.

Application examples of the auxiliary display unit 500 and the module 700 have already been described in the first embodiment and thus will not be described again.

As illustrated in FIGS. 6 and 8, the module 700 may include the wireless optical communication module 701 including a light-emitting unit 701a and a light-receiving unit 710b for communication, a first controller 702, and a second controller 703. The wireless optical communication module 701 may include a light-emitting unit 701a including a light-emitting element 711a of the display unit 11c of the electronic device 11 or an LED 721 and a light-receiving unit 701b including an optical sensor 722 or a front camera 711b.

Figure 9:
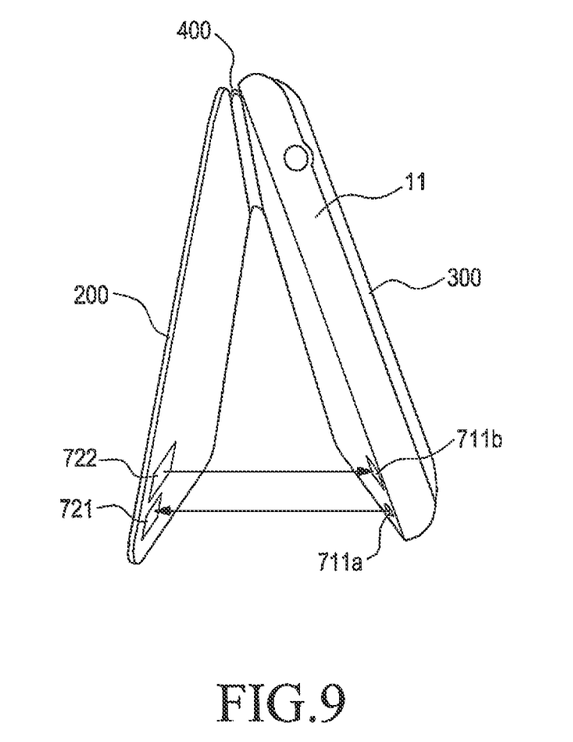
FIG. 9 is a diagram showing an operation process of a protecting cover of an electronic device according to the second embodiment of the present invention.

As illustrated in FIGS. 8 and 9, the optical sensor 722 is provided on the back surface of the front cover portion 200 to correspond to a light-emitting element 711a included in the display 11c of the electronic device 11. The LED 721 is provided on the back surface of the front cover portion 200 to correspond to a front camera 711b of the electronic device 11. The light-emitting element 711a may include one of an LCD and OLEDs. That is, if the light-emitting element 711a emits light having a color or flickering on-and-off light, the optical sensor 722 receives this optical signal. On the other hand, if the LED 721 emits light having a color or flickering on-and-off light, the front camera 711b receives this optical signal.

In other words, if the LED 721 provided on the front cover portion 200 emits and transmits light having a color or flickering on-and-off light, the front camera 711b of the electronic device 11 receives and detects the light and converts the light into a digital signal, such that the auxiliary display unit 500 of the front cover portion 200 transfers data to the electronic device 11. On the other hand, when the electronic device 11 transfers data to the auxiliary display unit 500 of the front cover portion 200, the light-emitting element 711a of the electronic device 11 emits and transmits light having a color or flickering on-and-off light and then the optical signal 722 receives the optical signal to convert the optical signal into a digital signal, and transfers data to the auxiliary display unit 500 for display on the auxiliary display unit 500.

The front cover portion 200 is rotated by the connection portion to cover the front surface of the electronic device 11. The front cover portion 200 closely contacts the front surface of the electronic device 11. The optical sensor 722 of the front cover portion 200 corresponds to the light-emitting element 711a provided on the front surface of the electronic device 11, and the LED 721 of the front cover portion 200 corresponds to the front camera 711b provided on the front surface of the electronic device 11.

For communication between the electronic device 11 and the auxiliary display unit 500 using the wireless optical communication module 701, if the light-emitting element 711a of the electronic device 11, which is included in the light-emitting unit 701a, and the LED 721 of the front cover portion 200, which is included in the light-emitting unit 701a, emit light having a color or flickering on-and-off light, the optical sensor 722 of the front cover portion 200 and the front camera 711b of the electronic device 11, which are included in the light-receiving unit 701b, receive the optical signal to convert the light into a digital signal and transfer data of the electronic device 11 to the auxiliary display unit 500 and data of the auxiliary display unit 500 to the electronic device 11. In this state, the auxiliary display unit 500 is turned on and activated, and the auxiliary display unit 500 receives and displays data of the electronic device 11. The auxiliary display unit 500 receives power of the battery pack (not illustrated) provided in the electronic device 11 through the power connection portion 600. As mentioned previously, the power connection portion 600 receives the power of the battery pack (not illustrated) included in the electronic device 11 through an existing wireless power transmission terminal (not illustrated) provided in the electronic device 11 and wirelessly supplies the power to the auxiliary display unit 500.

That is, the power connection portion (not illustrated) wirelessly transmits power through electromagnetic induction, without using a contact point of the terminal.

As illustrated in FIG. 8, if the user rotates the front cover portion 200 by means of the connection portion 400 to open the front surface of the electronic device 11, the front cover portion 200 rotates away from the front surface of the electronic device 11, and the front surface of the electronic device 11 also is positioned away from the LED 721 of the front cover portion 200, which is included in the light-emitting unit 701a, and the optical sensor 722 of the front cover portion 200, which is included in the light-receiving unit 701b. That is, the LED 721 and the optical sensor 722 are positioned away from the light-emitting element 711a of the electronic device 11, which is included in the light-emitting unit 701a, and the front camera 711b of the electronic device 11, which is included in the light-receiving unit 701b. Thus, the light-emitting unit 701a and the light-receiving unit 701b move beyond their transmission and reception areas. The auxiliary display unit 500 is turned off and the main display unit 11c of the electronic device 11 is turned on and activated.

As illustrated in FIG. 6, the first controller 702 controls driving of the wireless optical communication module 700 and the second controller 703 controls data transferred to the auxiliary display unit 500 to be displayed. A power management module 704 controls power supplied from the battery pack (not illustrated) of the electronic device 11 to be supplied to the auxiliary display unit 500. Moreover, the back cover portion 300 may include a circuit board 800 including the first controller 702, the second controller 703, the power management module 704, and the power connection portion 600.

The auxiliary display unit 500 may include at least one FPCB 900 for electric connection with the circuit board 800. The FPCB 900 includes a circuit connector 901 electrically connected with the circuit board 800. That is, the circuit connector 901 of the FPCB 900 is electrically connected with the circuit board 800 included in the back cover portion 300.

Herein, the operating process of the protecting cover according to the second embodiment of the present invention has already been described in detail in the aforementioned first embodiment and thus will not be described again.

To summarize, in the first embodiment of the present invention, the self-power supply unit (60 of FIG. 5) for supplying power to the auxiliary display unit (50 of FIG. 5) is provided to self-supply power necessary for the auxiliary display unit, and in the second embodiment of the present invention, to supply power to the auxiliary display unit (500 of FIG. 6), power is supplied by electric connection with the existing power terminal provided in the electronic device (11 of FIG. 8) or power is supplied wirelessly using a wireless power transmission terminal without a need for a separate connection terminal, such that the slimness of the protecting cover may be achieved and power supply to the auxiliary display unit may be facilitated.

Other effects that may be obtained or expected from the embodiments of the present invention are explicitly or implicitly disclosed in the detailed description of the embodiments of the present invention. That is, various effects expected from the embodiments of the present invention have been disclosed in the detailed description of the present invention.

While the present invention has been particularly shown and described with reference to certain embodiments thereof, various changes in form and detail may be made therein without departing from the spirit and scope of the present invention as defined by the following claims. Accordingly, the scope of the present invention will be defined by the appended claims and equivalents thereto.

What is claimed is:

1. A protecting cover for an electronic device, the protecting cover comprising:
a front cover portion that covers a front surface of the electronic device;
a back cover portion connectable with the front cover portion that covers a back surface of the electronic device;
an auxiliary display unit provided on the front cover portion;
a communication module configured to control transmission and reception of data between the electronic device and the auxiliary display unit, depending on opening and closing of the front cover portion; and
a power management module positioned on the back cover portion, wherein the power management module is configured to control a power of a self-power supply unit or a power supplied from a battery pack of the electronic device, depending on opening and closing of the front cover portion,
wherein the communication module comprises a wireless optical communication module comprising a light-emitting unit provided in the front cover portion and a light-receiving unit provided in the front cover portion,
wherein the light-emitting unit and the light-receiving unit closely contact each other and perform transmission and reception with each other using a light source to turn on the auxiliary display unit in a closed position of the front cover portion closely contacting a front surface of the electronic device, and
wherein the front cover portion rotates away from the front surface of the electronic device, and the light-emitting unit and the light-receiving unit are positioned away from each other and move beyond their transmission and reception regions of the light source to turn off the auxiliary display unit in an open position of the front cover portion by rotation.

2. The protecting cover of claim 1, wherein the auxiliary display unit comprises one of a flexible display, an Electrophoretic Display (EPD), an Electronic (E)-paper display, a Thin Film Transistor (TFT) Liquid Crystal Display (LCD), and an Organic Light Emitting Diode (OLED) display.

3. A protecting cover for an electronic device, the protecting cover comprising:
a front cover portion that covers a front surface of the electronic device;
a back cover portion connectable with the front cover portion that covers a back surface of the electronic device;
an auxiliary display unit provided on a front surface of the front cover portion;
a self-power supply unit provided on a back surface of the front cover portion to supply power to the auxiliary display unit;
a communication module configured to control transmission and reception of data between the electronic device and the auxiliary display unit, depending on opening and closing of the front cover portion; and
a power management module positioned on the back cover portion, wherein the power management module is configured to control power of the self-power supply unit, and
comprises a battery unit positioned on the back cover portion, the battery unit configured to charge using power from the self-power supply unit,
wherein the communication module comprises a wireless optical communication module comprising a light-emitting unit provided in the front cover portion and a light-receiving unit provided in the front cover portion,
wherein the light-emitting unit and the light-receiving unit closely contact each other and perform transmission and reception with each other using a light source to turn on the auxiliary display unit in a closed position of the front cover portion closely contacting a front surface of the electronic device, and
wherein the front cover portion rotates away from the front surface of the electronic device, and the light-emitting unit and the light-receiving unit are positioned away from each other and move beyond their transmission and reception regions of the light source to turn off the auxiliary display unit in an open position of the front cover portion by rotation.

4. The protecting cover of claim 3, wherein the auxiliary display unit comprises an Electrophoretic Display (EPD).

5. The protecting cover of claim 3, wherein the communication module comprises:
   a short-range communication module for the transmission and reception of the data;
   a first controller configured to control a signal of the short-range communication module; and
   a second controller configured to control data to be transmitted to the auxiliary display unit and the data to be displayed.

6. The protecting cover of claim 5, wherein the short-range communication module comprises at least one of a Bluetooth module, a WiFi module, a Radio Frequency Identification (RFID) module, and a Near-Field Communication (NFC) module.

7. The protecting cover of claim 3, wherein the self-power supply unit comprises a solar cell.

8. The protecting cover of claim 5, wherein the back cover portion comprises a circuit board comprising the first and second controllers, the power management module, and the battery unit.

9. A protecting cover of an electronic device, the protecting cover comprising:
   a front cover portion that covers a front surface of the electronic device;
   a back cover portion connectable with the front cover that covers a back surface of the electronic device;
   an auxiliary display unit provided on the front cover portion;
   a power connection portion electrically connected with a battery pack of the electronic device to supply power to the auxiliary display unit;
   a communication module configured to control transmission and reception of data between the electronic device and the auxiliary display unit, depending on opening and closing of the front cover portion; and
   a power management module positioned on the back cover portion, wherein the power management module is configured to control power supplied from a battery pack of the electronic device, depending on opening and closing of the front cover portion,
   wherein the communication module comprises a wireless optical communication module comprising a light-emitting unit provided in the front cover portion and a light-receiving unit provided in the front cover portion, wherein the light-emitting unit and the light-receiving unit closely contact each other and perform transmission and reception with each other using a light source to turn on the auxiliary display unit in a closed position of the front cover portion closely contacting a front surface of the electronic device, and
   wherein the front cover portion rotates away from the front surface of the electronic device, and the light-emitting unit and the light-receiving unit are positioned away from each other and move beyond their transmission and reception regions of the light source to turn off the auxiliary display unit in an open position of the front cover portion by rotation.

10. The protecting cover of claim 9, wherein the communication module comprises:
    a short-range communication module for the transmission and reception of the data;
    a first controller configured to control a signal of the short-range communication module;
    a second controller configured to control data to be transmitted to the auxiliary display unit and to control the data to be displayed.

11. The protecting cover of claim 10, wherein the short-range communication module comprises at least one of a Bluetooth module, a WiFi module, a Radio Frequency Identification (RFID) module, and a Near-Field Communication (NFC) module.

12. The protecting cover of claim 10, wherein the back cover portion comprises a circuit board comprising the first controller, the second controller, and the power management module.

13. The protecting cover of claim 9, wherein the power connection portion comprises a power connection terminal electrically connected with a power terminal provided in the electronic device.

14. The protecting cover of claim 9, wherein the power connection portion is wirelessly connected with a wireless power transmission terminal provided in the electronic device.

15. The protecting cover of claim 1, wherein the light-emitting unit comprises a light-emitting element provided in the electronic device or a Light Emitting Diode (LED) provided in the front cover portion, and
    wherein the light-receiving unit comprises an optical sensor provided in the front cover portion or a front camera provided in the electronic device.

* * * * *